US006878613B2

(12) United States Patent
Stottko et al.

(10) Patent No.: US 6,878,613 B2
(45) Date of Patent: Apr. 12, 2005

(54) FIELD-EFFECT TRANSISTOR HAVING A CONTACT TO ONE OF ITS DOPING REGIONS, AND METHOD FOR FABRICATING THE TRANSISTOR

(75) Inventors: Bernd Stottko, Dresden (DE); Martin Welzel, Dresden (DE); Jens Zimmermann, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/231,882

(22) Filed: Aug. 30, 2002

(65) Prior Publication Data

US 2003/0042517 A1 Mar. 6, 2003

(30) Foreign Application Priority Data

Aug. 30, 2001 (DE) .......................................... 101 42 340

(51) Int. Cl.[7] ............................................ H01L 21/336
(52) U.S. Cl. ........................ 438/592; 438/299; 438/301; 438/303; 438/595
(58) Field of Search ................................ 438/299, 301, 438/303, 592, 595

(56) References Cited

U.S. PATENT DOCUMENTS

| 5,256,585 | A | * | 10/1993 | Bae ............................ 438/304 |
|---|---|---|---|---|
| 5,545,578 | A | | 8/1996 | Park et al. |
| 5,599,725 | A | * | 2/1997 | Dorleans et al. ............. 438/301 |
| 5,751,048 | A | | 5/1998 | Lee et al. ..................... 257/412 |
| 5,908,791 | A | | 6/1999 | Han et al. ..................... 438/738 |
| 5,939,761 | A | | 8/1999 | Dennison et al. ............ 257/387 |
| 5,994,192 | A | * | 11/1999 | Chen ............................ 438/303 |
| 6,001,719 | A | * | 12/1999 | Cho et al. .................... 438/592 |
| 6,040,241 | A | * | 3/2000 | Lee et al. ..................... 438/622 |
| 6,091,120 | A | | 7/2000 | Yeom et al. .................. 257/401 |
| 6,259,144 | B1 | | 7/2001 | Gonzalez ..................... 257/412 |

FOREIGN PATENT DOCUMENTS

JP 04275434 A * 10/1992 ......... H01L/21/336

* cited by examiner

Primary Examiner—Tom Thomas
Assistant Examiner—N. Drew Richards
(74) Attorney, Agent, or Firm—Laurence A. Greenberg; Werner H. Stemer; Ralph E. Locher

(57) ABSTRACT

A field-effect transistor is formed with a gate stack, which is patterned by a hard mask and contains a first part of a gate electrode and a second part of the gate electrode that is disposed on the first part. The second part of the gate electrode, which is disposed between the patterned hard mask and the first part of the gate electrode, is laterally recessed, so that the second part of the gate electrode, in a contact hole which is subsequently formed, is at a greater distance from a contact plug with which the contact hole is filled, in order to avoid short circuits.

7 Claims, 5 Drawing Sheets

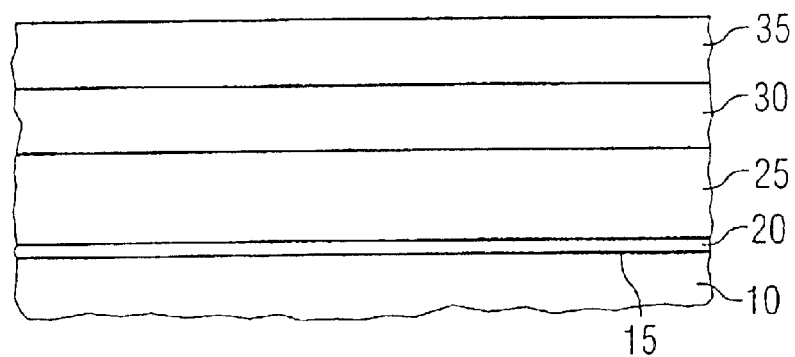
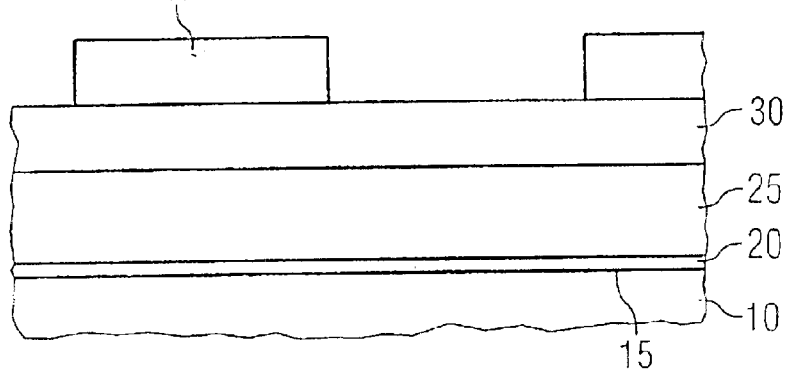
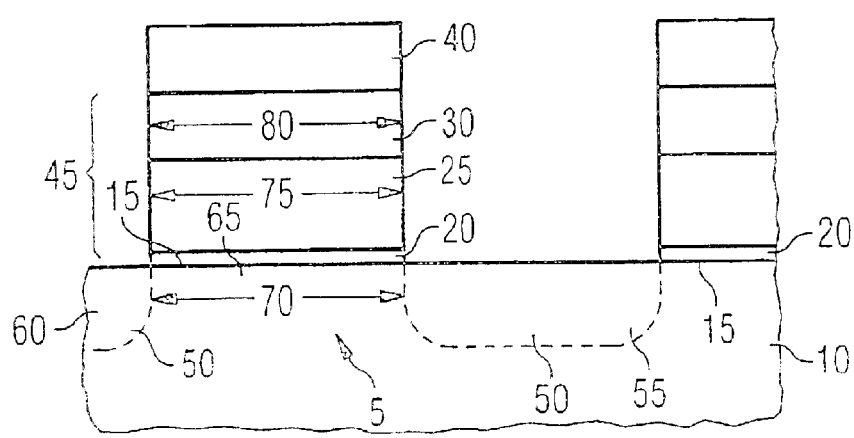

FIELD-EFFECT TRANSISTOR HAVING A CONTACT TO ONE OF ITS DOPING REGIONS, AND METHOD FOR FABRICATING THE TRANSISTOR

BACKGROUND OF THE INVENTION

Field of the Invention

The present invention relates to a field-effect transistor having a contact to one of its doping regions, and to a method for fabricating it.

In the technical field of semiconductor components, such as for example field-effect transistors, it is customary and necessary to produce an electrical contact to a doped region that is disposed in a semiconductor substrate. By way of example, if two adjacent gates of two adjacent field-effect transistors are disposed next to one another on the surface of a semiconductor substrate and a doping region is disposed between the two gates in the semiconductor substrate, it is known to line the two gates on their surfaces and side walls with a liner as an etching mask, in order to form a self-aligned contact to the doping region between the two gates. By way of example, U.S. Pat. No. 5,908,791 discloses a device with a gate electrode and a layer of WSi (tungsten silicide).

The cladding of the two gates is typically formed from silicon nitride, and the gates are typically formed from polycrystalline silicon. The gates and the substrate are usually covered with a silicon oxide in which contact holes are disposed. The etching selectivity between the layer of silicon oxide and the liners made from silicon nitride is used to form the contact holes. By way of example, the mask which is used to pattern the contact holes between the two gates may be misaligned, so that a contact hole which is subsequently etched using the patterned etching mask would be formed not only between but also into a gate. This is usually prevented by the liners, which contain silicon nitride, wince the etching of the contact holes through the liners, which have a significantly lower etching rate than the silicon oxide, is directed between the two gates, the two gates being protected from the contact-hole etching by the liner containing silicon nitride.

However, a drawback of the prior art is that during the etching of the contact holes material is also removed from the liner formed around the gate, so that holes may form in the liner, and may lead to damage to the gate and/or to a short circuit between the gate and a contact plug which has been introduced into the contact hole.

SUMMARY OF THE INVENTION

It is accordingly an object of the invention to provide a field-effect transistor having a contact to one of its doping regions, and a method for fabricating the transistor which overcomes the above-mentioned disadvantages of the prior art methods of this general type, in which a short circuit between the doping region and the gate of the field-effect transistor is avoided, and to provide a corresponding method for its fabrication.

With the foregoing and other objects in view there is provided, in accordance with the invention, a field-effect transistor based circuit configuration. The circuit configuration contains a substrate having a substrate surface and a transistor having a source doping region disposed in the substrate, a drain doping region disposed in the substrate, and a channel. The channel is disposed between the source doping region and the drain doping region and has a channel length. A gate oxide is disposed on the substrate surface and on the channel. A first part of a gate electrode is disposed on the gate oxide, and a second part of the gate electrode is disposed on the first part of the gate electrode. The first and second parts of the gate electrode form a gate stack. The first part of the gate electrode, in a direction of the channel length, has a first dimension, and the second part of the gate electrode, in the direction of the channel length, has a second dimension. The first dimension is greater than the second dimension. A first insulating layer is disposed on the second part of the gate electrode. A second insulating layer is disposed on the first insulating layer and on the substrate surface. The second insulating layer has a contact hole formed therein, and the contact hole is formed next to the gate stack in the second insulating layer. A contact plug fills the contact hole, and the contact plug makes contact with the source doping region at the substrate surface.

The gate stack according to the invention contains the first part of the gate electrode and the second part of the gate electrode, the first part of the gate electrode being formed on the gate oxide and contains, for example, doped polycrystalline silicon. The second part of the gate electrode is disposed on the first part of the gate electrode and is formed, for example, by a material of good conductivity, such as tungsten silicide or tungsten. The gate stack is formed in such a way that the second part of the gate electrode has a smaller dimension than the first part of the gate electrode. Therefore, the second part of the gate electrode is further away from the contact hole, with the result that short circuit between the contact plug which has been introduced into the contact hole and the second part of the gate electrode are avoided. The second part of the gate electrode is at a further distance from the contact hole than the first part of the gate electrode, so that the first insulating layer, which protects the first part of the gate electrode and the second part of the gate electrode, acting as a liner, during the contact hole etching, is formed with a greater thickness next to the second part of the gate electrode, so that there is improved protection for the gate stack.

An advantageous embodiment of the invention provides for the first part of the gate electrode to have a first side wall, which faces the contact hole, and for the second part of the gate electrode to have a second side wall, which faces the contact hole, and for the second side wall to be at a greater distance from the contact hole than the first side wall. The result of this is that the distance between the second part of the gate electrode and the contact hole is increased, so that the second part of the gate electrode and therefore the gate stack are better protected during the etching of the contact hole.

According to a further configuration of the field-effect transistor, the first insulating layer has a third side wall, which faces the contact hole, and the second side wall is laterally recessed into the second part of the gate electrode with respect to the first and third side walls. It is clear from this that the second part of the gate electrode, which is disposed between the first insulating layer and the first part of the gate electrode, is laterally recessed, so that it is at a greater distance from the contact hole which is subsequently etched. The first insulating layer, which is disposed on the second part of the gate electrode, is usually used as a hard mask for the patterning of the gate stack. It then remains as an insulating layer and assists with the self-aligned formation of the contact hole on the gate stack.

According to a further configuration of the field-effect transistor according to the invention, a third insulating layer is disposed on the first insulating layer and laterally on the gate stack, and the second insulating layer is disposed on the third insulating layer. Consequently, the third insulating layer is disposed between the first insulating layer and the second insulating layer and may, for example, be configured as a liner which is disposed conformally on the gate stack, laterally on the gate stack and on the substrate surface. The liner then assists with the self-aligned formation of the contact hole.

According to a further configuration of the field-effect transistor according to the invention, a trench capacitor, which is connected to the drain doping region of the field-effect transistor in order to form a semiconductor memory cell, is disposed in the substrate. Therefore, according to the invention, the claimed field-effect transistor with the laterally recessed second gate electrode can be used as a select transistor for a dynamic random access memory (DRAM) cell.

According to a further configuration of the field-effect transistor according to the invention, a second-field-effect transistor, which has a common source doping region with the field-effect transistor, is disposed in the substrate. Since the contact hole can now be disposed between two gate stacks of two adjacent field-effect transistors, the result is space-saving utilization of the substrate surface available.

With regard to the method, the object is achieved by a method for fabricating a field-effect transistor, including the steps of:

a) providing a substrate which has a substrate surface;
b) forming a gate oxide on the substrate surface;
c) forming a first part of the gate electrode on the gate oxide;
d) forming a second part of the gate electrode on the first part of the gate electrode;
e) forming a first insulating layer on the second part of the gate electrode;
f) patterning the first insulating layer to form a patterned hard mask;
g) patterning the second part of the gate electrode and the first part of the gate electrode using the hard mask as an etching mask, so as to form a gate stack;
h) introducing a dopant into the substrate in order to form a source doping region and a drain doping region;
i) removing material from the second part of the gate electrode in the lateral direction, before the second insulating layer is deposited, in order to produce an overhang;
j) depositing a second insulating layer on the first insulating layer and the substrate surface;
k) forming a contact hole next to the gate stack in the second insulating layer, the source doping region being uncovered at the substrate surface; and
l) filling the contact hole with a contact plug.

The fact that the second part of the gate electrode is laterally recessed results in that it is at a greater distance from the contact hole that is subsequently etched. Before the contact hole is etched, it is therefore possible for the second part of the gate electrode to be protected with a thicker insulating layer as a self-aligning mask, with the result that a short circuit between the gate and the contact plug which has been introduced into the contact hole can be avoided.

A further method step provides for the second part of the gate electrode to be laterally recessed by more than 5 nm, preferably more than 10 nm. A recess of 5 nm or preferably 10 nm ensures an improved safety margin between the second part of the gate electrode and the contact plug that is subsequently introduced into the contact hole.

A further advantageous configuration of the method according to the invention provides for the second part of the gate electrode to have a layer thickness perpendicular to the substrate surface and for the second part of the gate electrode to be laterally eroded or recessed by at least half the layer thickness.

This once again allows an improved safety margin between the gate and the contact plug. In this case, the safety margin is defined by the relative dimensions of the semiconductor component.

According to a further configuration of the method according to the invention, the second part of the gate electrode is recessed by up to twice the layer thickness.

Other features which are considered as characteristic for the invention are set forth in the appended claims.

Although the invention is illustrated and described herein as embodied in a field-effect transistor having a contact to one of its doping regions, and a method for fabricating the transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view through a substrate to which a first part of a gate electrode, a second part of the gate electrode and a first insulating layer are applied according to the invention;

FIG. 2 is a sectional view following FIG. 1 in which the first insulating layer has been formed into a patterned hard mask;

FIG. 3 is a sectional view following FIG. 2, in which a gate stack has been etched by use of the hard mask and a dopant has been introduced into the substrate;

DESCRIPTION OF THE PREFERRED EMBODIMENTS

Figure 4:
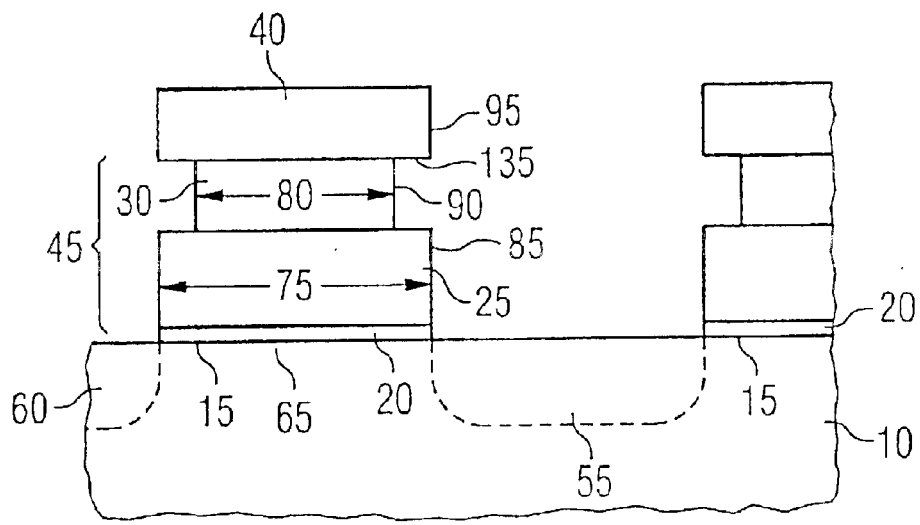
FIG. 4 is a sectional view following FIG. 3, in which the second part of the gate electrode has been laterally recessed.

Referring now to the figures of the drawing in detail and first, particularly, to FIG. 1 thereof, there is shown a substrate 10 which has a substrate surface 15. By way of example, the substrate 10 is formed from p-doped or n-doped silicon. A gate oxide 20 is disposed on the substrate surface 15. A gate electrode that contains a plurality of layers is disposed on the gate oxide 20. A first part 25 of the gate electrode is disposed directly on the gate oxide 20. The gate oxide 20 contains, for example, silicon oxide or silicon nitride, and the first part 25 of the gate electrode is typically formed from doped polycrystalline silicon. A second part 30, in the form of a second layer, is disposed on the first part 25 of the gate electrode. The second part 30 of the gate electrode typically contains materials or metals of good conductivity, such as for example titanium silicide, tungsten silicide, molybdenum silicide, tantalum silicide, cobalt silicide or nickel silicide. Metals that are typically suitable for the second part 30 of the gate electrode are titanum, tungsten, aluminum or tantalum. It is also possible for the second part 30 of the gate electrode to contain a conductive nitride, such as for example titanium nitride, tungsten nitride or tantalum nitride. A first insulating layer 35 is disposed on the second part 30 of the gate electrode. By way of example, the first insulating layer 35 contains silicon nitride.

In a method for fabricating the configuration illustrated in FIG. 1, the substrate 10 is oxidized at an elevated temperature in an oxygen-and/or nitrogen-containing atmosphere, in order to form the gate oxide 20. Then, the first part 25 of the gate electrode is deposited on the gate oxide 20. Next, the second part 30 of the gate electrode is deposited on the first part 25 of the gate electrode. The second part 30 of the gate electrode may be deposited as a silicide or as a metal and, in a subsequent heat-treatment step, can be reacted with the first gate electrode 20 below it, by a heat-treatment step, to form a silicide.

Referring now to FIG. 2, the first insulating layer 35 is patterned by a suitable lithography and patterning process, a patterned hard mask 40 being formed from the first insulating layer 35.

Referring now to FIG. 3, a gate stack 45 containing the first part 25 of the gate electrode and the second part 30 of the gate electrode is patterned by an etching process using the hard mask 40. Then, a dopant 50 is introduced into the substrate 10, with the result that a source doping region 55 and a drain doping region 60 are formed in the substrate 10, in each case laterally next to the gate stack 45. Therefore, features of a field-effect transistor 5 have been formed, a channel 65 of the transistor being disposed at the substrate surface 15, below the gate oxide 20, between the source doping region 55 and the drain doping region 60. The channel 65 has a channel length 70. As a result of the patterning of the gate stack 45, the first part 25 of the gate electrode is formed with a first dimension 75 that runs in the direction of the channel length 70. In a corresponding way, the second part 30 of the gate electrode is formed with a second dimension 80, which likewise runs in the direction of the channel length 70.

Referring now to FIG. 4, the second part 30 of the gate electrode is laterally recessed, so that its second dimension 80 becomes smaller than the first dimension 75 of the first part 25 of the gate electrode. If the second part 30 of the gate electrode is formed of, for example, tungsten silicide, the lateral removal of material can be carried out using ammonium peroxide. For this purpose, ammonium peroxide is introduced in liquid form. Dry-chemical and wet-chemical etching processes in general are possible. Suitable etching substances are HCl, HBr, $NF_3$, $SF_6$ or $Cl_2$ and essentially fluorine or chlorine compounds. Plasma-enhanced etching is also suitable. Isotropic, plasma-enhanced etching, such as reactive ion etching (REI) or downstream plasma can be carried out at room temperature within a few seconds.

The first part 25 of the gate electrode has a first side wall 85, the second part 30 of the gate electrode has a second side wall 90, and the patterned hard mask 40 has a third side wall 95. The recess provided between the first, second and third side walls 85, 90, 95, which originally adjoined one another in planar fashion, are provided with a stepped profile, since the second side wall 90 is now eroded or recessed laterally into the second part 30 of the gate electrode, an overhang 135 being formed below the patterned hard mask 40.

Figure 5:
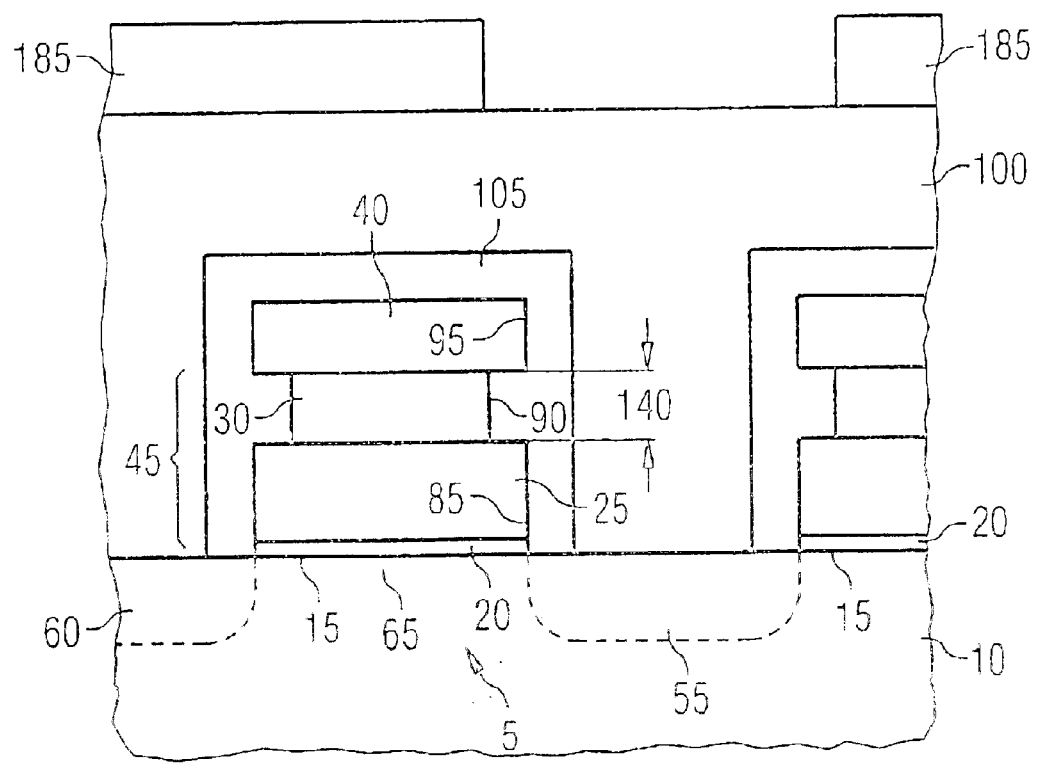
FIG. 5 is a sectional view following FIG. 4, with additional insulating layers.

Then, referring now to FIG. 5, a third insulating layer 105 is deposited as an encapsulation on the patterned hard mask 40 and on the side of the gate stack 45. The third insulating layer 105 is formed, for example, from silicon nitride. For this purpose, the third insulating layer 105 may be deposited conformally and removed from the substrate surface 15 of the source doping region 55 by a directional etching. Then, a second insulating layer 100 is deposited on the third insulating layer 105 and on the uncovered substrate surface 15 of the source doping region 55. The second insulating layer 100 is formed, for example, from a doped silicate glass. Then, a patterned etching mask 185, which is suitable for etching a contact hole 110, is formed on the second insulating layer 100. The second gate electrode 30 is formed with a layer thickness 140 perpendicular to the substrate surface 15. The amount of material removed from the second gate electrode 30 is between half the layer thickness 140 and twice the layer thickness 140.

Figure 6:
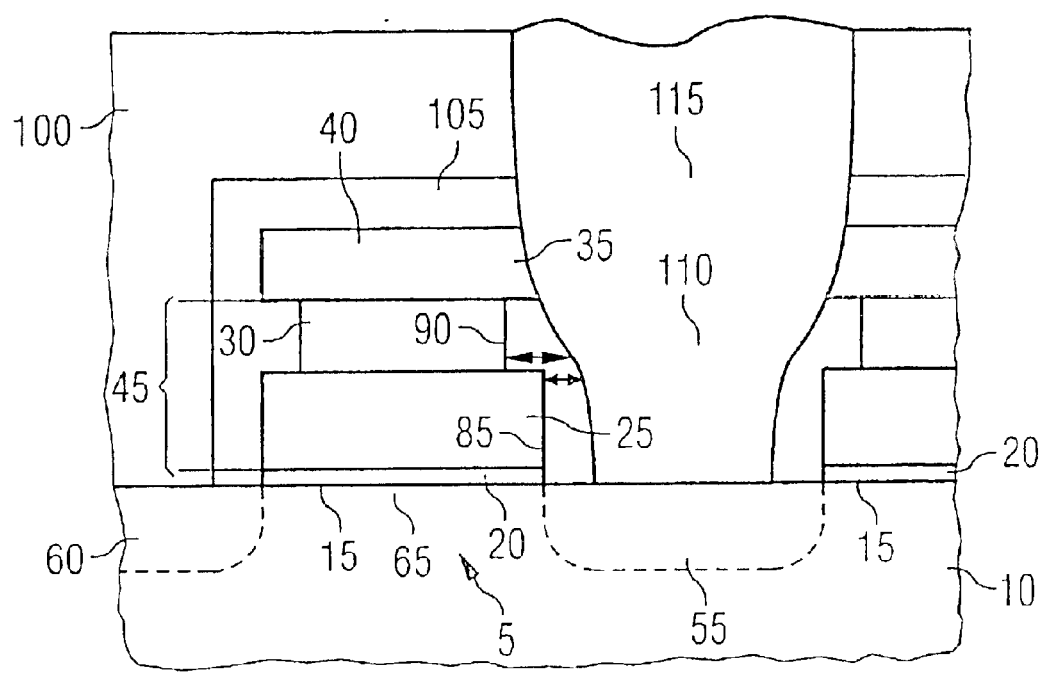
FIG. 6 is a sectional view following FIG. 5, in which a contact hole has been etched.

Then, referring now to FIG. 6, the contact hole 110 is etched into the second insulating layer 100 using the etching mask 185. The third insulating layer 105 may also be partially etched during the etching of the contact hole 110 as a result of dealignments.

In this case, the third insulating layer 105 and the first insulating layer 35 as the patterned hard mask 40 are etched significantly more slowly than the second insulating layer 100. The significantly higher etching resistance of the third insulating layer 105 and of the first insulating layer 35 results in that the contact hole etching is self-aligned with respect to the source doping region 55. The second gate electrode 30 is at an increased distance from the contact hole 110 and a contact plug 115 that is subsequently introduced into the contact hole 110, since it is laterally recessed. As a result, a short circuit between the contact plug 115 and the second part 30 of the gate electrode is avoided.

Figure 7:
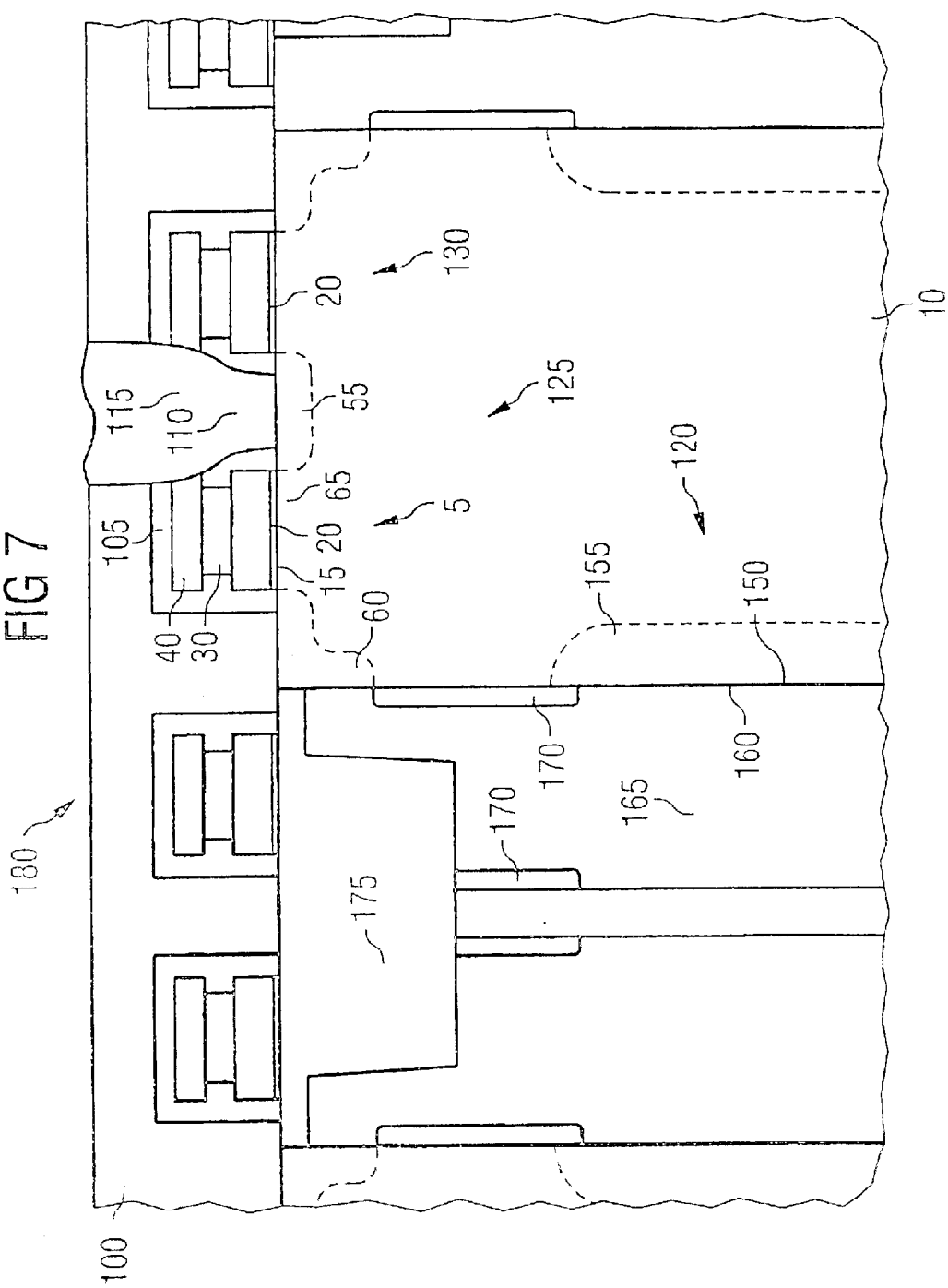
FIG. 7 is a sectional view following FIG. 6, in conjunction with a memory cell of a semiconductor memory.

Referring now to FIG. 7, the excerpt illustrated in FIG. 6 is embedded as part of a memory cell of a semiconductor memory. Next to the drain doping region 60 there is a trench 150 in which a trench capacitor 120 is formed. The trench capacitor 120, together with the field-effect transistor 5, forms a semiconductor memory cell 125. Adjacent to the field-effect transistor 5, FIG. 7 illustrates a second field-effect transistor 130 that has a common source doping region 55 with the field-effect transistor 5.

The inventive configuration of the second part 30 of the gate electrode of the field-effect transistor 5 is not restricted to its use as a select transistor of a semiconductor memory cell, but rather it can also be used for transistors in logic circuits, such as processors and microcontrollers.

An outer capacitor electrode 155 is formed around the trench 150 by a dopant in the substrate 10. A capacitor dielectric 160 is disposed on the sidewall of the trench 150, and an inner capacitor electrode 165 is disposed in the interior of the trench 150. An insulating collar 170 is disposed in the upper region of the trench 150, on the sidewall of the trench 150. On that side of the field-effect transistor 5 which is remote from the second field-effect transistor 130 there is a passing word line 180 on a shallow trench isolation (STI).

Figure 8:
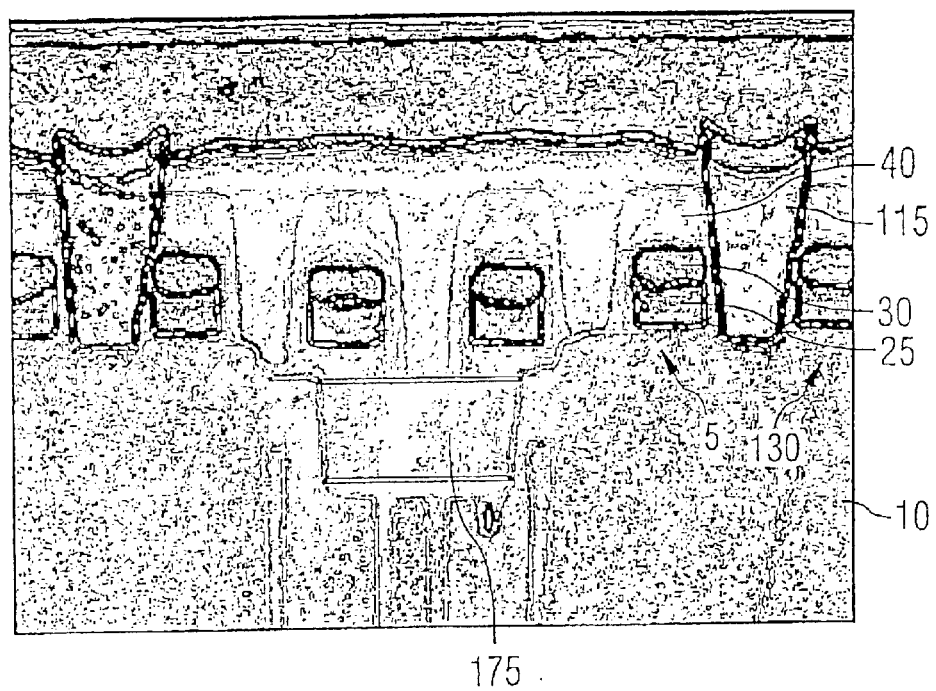
FIG. 8 is a scanning electron microscope image of a section through a substrate according to the prior art, in which a short circuit occurs between the contact plug disposed in the contact hole and the gate of the transistor.

FIG. 8 shows a scanning electronic microscope (SEM) image. FIG. 8 shows a sectional image through memory cells of a semiconductor memory according to the prior art. The substrate 10 on which the field-effect transistor 5 is disposed is easily recognizable. The field-effect transistor 5 has the first part 25 of the gate electrode and a layer for the second part 30 of the gate electrode disposed on the first part 25 of the gate electrode. The patterned hard mask 40 is disposed on the second part 30 of the gate electrode. The contact plug 115 is formed next to the gate stack, and the second field-effect transistor 130 is disposed next to the contact plug. It is clearly apparent that the contact plug 115 is at a very short distance from the second gate electrode 30, which can lead to short circuits between the second part 30 of the gate electrode and the contact plug 115.

Figure 9:
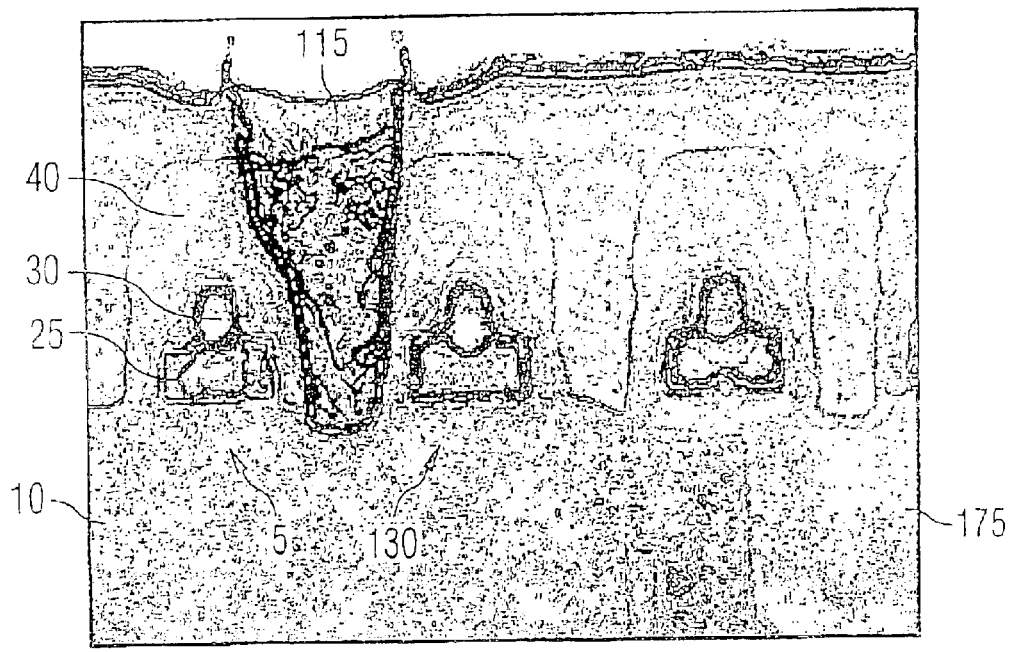
FIG. 9 is a scanning electron microscope image of a section through the substrate, in which the second part of the gate electrode is laterally recessed according to the invention.

FIG. 9 shows an SEM image of a section through the substrate 10. The field-effect transistor 5 according to the invention, which has the first part 25 of the gate electrode and the second part 30 of the gate electrode, is formed on the substrate 10. The patterned hard mask 40 is disposed on the second part 30 of the gate electrode. The contact plug 115 is disposed next to the field-effect transistor 5. The second part 30 of the gate electrode is laterally recessed in accordance with the invention, so that the distance between it and the contact plug 115 is increased. This advantageously makes it possible to avoid short circuits between the second part 30 of the gate electrode and the contact plug 115.

We claim:

1. A method for fabricating a field-effect transistor, which comprises the steps of:

providing a substrate having a substrate surface;

forming a gate oxide on the substrate surface;

forming a first part of a gate electrode on the gate ocide;

forming a second part of the gate electrode on the first part of the gate electrode;

forming a first insulating layer on the second part of the gate electrode;

patterning the first insulating layer to form a patterned hard mask;

patterning the second part of the gate electrode and the first part of the gate electrode using the patterned hard mask as an etching mask, to form a gate stack;

introducing a dopant into the substrate to form a source doping region and a drain doping region;

removing material from the second part of the gate electrode in a lateral direction to produce an overhang;

depositing a third insulating layer covering the first insulating layer above the gate stack, the gate stack, and sidewalls of the gate stack;

removing the third insulating layer from the surface of the substrate by a directional etching;

depositing a second insulating layer on the third insulating layer and on the uncovered substrate surface after the directional etching of the third insulating layer;

forming a contact hole next to the gate stack in the second insulating layer by self-aligning etching with an etching rate of the second insulating layer being greater than etching rates of the first and third insulating layers causing the contact hole etching to be self-aligned with respect to the source doping region, the source doping region being uncovered at the substrate surface, the self-aligning etching of the second insulating layer being performed in a mingle etching step resulting in the contact hole next to the gate stack, the contact hole reaching from the top of the second insulating layer to the source drain region in the substrate; and filling the contact hole with a contact plug.

2. The method according to claim 1, which comprises removing more than 5 nm of the material in the lateral direction from the second part of the gate electrode.

3. The method according to claim 1, which comprises forming the second part of the gate electrode with a layer thickness perpendicular to the substrate surface, and removing the material amounting to at least half the layer thickness from the second part of the gate electrode in the lateral direction during the removing step.

4. The method according to claim 3, which comprises removing the material in an amount of up to twice the layer thickness from the second part of the gate electrode in the lateral direction.

5. The method according to claim 1, which comprises removing more than 10 nm of the material in the lateral direction from the second part of the gate electrode.

6. The method according to claim 1, which comprises forming the second insulating layer of silicate glass.

7. The method according to claim 6, which comprises forming the first and third insulating layers of silicon nitride.

* * * * *

UNITED STATES PATENT AND TRADEMARK OFFICE
CERTIFICATE OF CORRECTION

PATENT NO. : 6,878,613 B2
DATED : April 12, 2005
INVENTOR(S) : Bernd Stottko et al.

It is certified that error appears in the above-identified patent and that said Letters Patent is hereby corrected as shown below:

<u>Column 8,</u>
Line 8, should read as follows:
removing the third insulating layer from the surface of the
Line 21, should read as follows:
being performed in a single etching step resulting in Signed and Sealed this Twelfth Day of July, 2005

JON W. DUDAS
*Director of the United States Patent and Trademark Office*